(12) United States Patent
Kim et al.

(10) Patent No.: US 8,664,021 B2
(45) Date of Patent: Mar. 4, 2014

(54) ORGANIC LIGHT-EMITTING DISPLAY DEVICE AND FOLDABLE DISPLAY DEVICE INCLUDING THE SAME

(75) Inventors: Sun-kook Kim, Hwaseong-si (KR); In-seo Kee, Seongnam-si (KR); Sang-yoon Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 105 days.

(21) Appl. No.: 13/297,495

(22) Filed: Nov. 16, 2011

(65) Prior Publication Data

US 2012/0119239 A1    May 17, 2012

(30) Foreign Application Priority Data

Nov. 17, 2010  (KR) .................. 10-2010-0114561

(51) Int. Cl.
*H01L 21/00* (2006.01)
*H01L 33/00* (2010.01)

(52) U.S. Cl.
USPC .............................................. 438/29; 257/98

(58) Field of Classification Search
USPC .................. 257/98–100, 79, 749; 438/22–32
See application file for complete search history.

(56) References Cited

U.S. PATENT DOCUMENTS

| | | | | |
|---|---|---|---|---|
| 6,911,772 | B2 * | 6/2005 | Cok | 313/501 |
| 7,816,856 | B2 * | 10/2010 | Cok et al. | 313/503 |
| 8,174,179 | B2 * | 5/2012 | Suh | 313/501 |
| 8,305,294 | B2 * | 11/2012 | Cok et al. | 345/1.3 |
| 2006/0220008 | A1 | 10/2006 | Ko | |
| 2009/0079328 | A1 * | 3/2009 | Fedorovskaya et al. | 313/504 |

FOREIGN PATENT DOCUMENTS

| | | |
|---|---|---|
| JP | 8-508114 A | 8/1996 |
| JP | 2006-269327 A | 10/2006 |
| KR | 10-2010-0021360 A | 2/2010 |
| WO | 95/17690 A1 | 6/1995 |

* cited by examiner

*Primary Examiner* — Calvin Lee
(74) *Attorney, Agent, or Firm* — Cantor Colburn LLP

(57) ABSTRACT

An organic light-emitting display device includes a plurality of first and second electrodes which are spaced apart from each other on a substrate, a plurality of light-emitting layers between the first and second electrodes, a flexible thin encapsulation film on the second electrodes, and a color filter on the flexible thin encapsulation film.

22 Claims, 5 Drawing Sheets

ORGANIC LIGHT-EMITTING DISPLAY DEVICE AND FOLDABLE DISPLAY DEVICE INCLUDING THE SAME

CROSS-REFERENCE TO RELATED APPLICATIONS

This application claims priority to Korean Patent Application No. 10-2010-0114561, filed on Nov. 17, 2010, and all the benefits accruing therefrom under 35 U.S.C. §119, the disclosure of which is incorporated herein in its entirety by reference.

BACKGROUND

1. Field

Provided are organic light-emitting display devices, and foldable display devices, and more particularly, organic light-emitting display devices including color filters, and foldable display devices including the organic light-emitting display device.

2. Description of the Related Art

An organic light-emitting display device emits light of a predetermined color and displays an image by combining electrons and holes in an organic light-emitting layer when a current or a voltage is applied to the organic light-emitting layer. The organic light-emitting display device may be driven at a low voltage, may realize high luminance, and have fast response speeds. In addition, the organic light-emitting display device has a wide color reproduction range, and wide view angles. In general, the organic light-emitting display device uses a glass encapsulation film to protect the organic light-emitting layer from water or oxygen. Since the glass encapsulation film easily breaks, it is difficult to use the glass encapsulation film in a flexible display apparatus.

In order to improve outdoor visibility of an organic light-emitting display device, a method using a polarization film has been used. However, since the polarization film has a low transmittance of about 45%, a reflectance of external light may not be reduced greatly by the polarization film. In addition, the polarization film easily breaks, and thus, it is difficult to use the polarization film in a flexible display apparatus.

SUMMARY

Provided are flexible organic light-emitting display devices for ensuring outdoor visibility, and a foldable display device including the flexible organic light-emitting display devices.

Additional aspects will be set forth in part in the description which follows and, in part, will be apparent from the description, or may be learned by practice of the presented embodiments.

Provided is an organic light-emitting display device which includes a substrate; a plurality of first electrodes on the substrate; a plurality of light-emitting layers on the plurality of first electrodes and having different colors and different thicknesses; a plurality of second electrodes on the light-emitting layers; a flexible thin encapsulation film on the plurality of second electrodes; and a color filter on the flexible thin encapsulation film and including a plurality of color filter layers having colors corresponding to the plurality of light-emitting layers.

The flexible thin encapsulation film may have a thickness of about 1 micrometer (μm) to about 10 μm. The flexible thin encapsulation film may include at least one organic material layer and at least one inorganic material layer which alternate with each other. In this case, the at least one organic material layer may include acrylate-based material, and the at least one inorganic material layer may include an oxide-based material. The flexible thin encapsulation film may include a material grown at a low temperature of 100 degrees Celsius (° C.) or less.

When a wavelength of light transmitted through a color filter layer of a predetermined color is $\lambda$, and a thickness and a refractive index of a light-emitting layer corresponding to the color filter layer are L and n, respectively, $2\,\mathrm{mL}=\mathrm{m}\lambda$, or $2\,\mathrm{nL}=(\mathrm{m}+1/2)\lambda$ (where m is an integer) is satisfied.

The plurality of first electrodes may include a material having a reflectance of substantially 100%. The plurality of second electrodes may include a material having transmittance of about 40% to about 60%.

The substrate may include a flexible substrate.

The color filter may include an organic material on which a curing process is performed by using ultraviolet ("UV") rays at a temperature of about 100° C. or less.

The plurality of color filter layers may include red, green, and blue color filter layers, and the plurality of light-emitting layers may include red, green, and blue light-emitting layers.

The plurality of first electrodes may correspond to the plurality of light-emitting layers, and the plurality of second electrodes may collectively form a single unitary indivisible common electrode. The plurality of first electrodes and the plurality of second electrodes may be stripe-shaped and respectively cross each other.

Provided is a foldable display device which includes first and second organic light-emitting display panels of which at least portions overlap each other; and a transparent plate surrounding at least a portion of the second organic light-emitting display panel and covering the first organic light-emitting display panel. Each of the first and second organic light-emitting display panels includes: a substrate; a plurality of first electrodes on the substrate; a plurality of light-emitting layers on the plurality of first electrodes and having different colors and different thicknesses; a plurality of second electrodes on the light-emitting layers; a flexible thin encapsulation film on the plurality of second electrodes; and a color filter on the flexible thin encapsulation film and including a plurality of color filter layers having colors corresponding to the plurality of light-emitting layers.

The transparent plate may include a soft material. The transparent plate may be integral with the second organic light-emitting display panel. The foldable display device may further include an optical film on the transparent plate.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
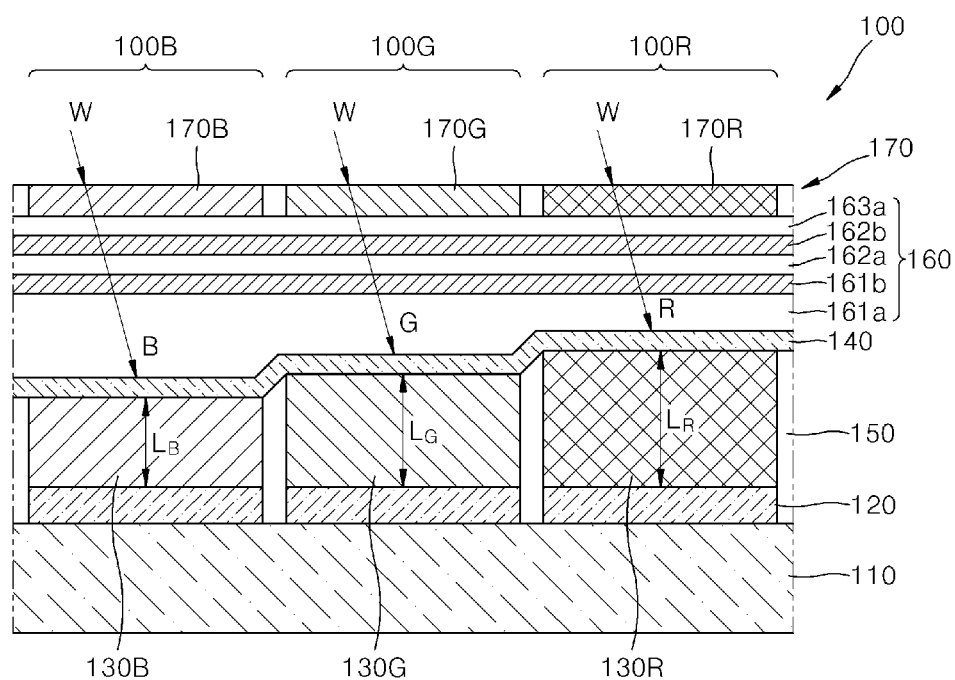
FIG. 1 is a cross-sectional view of an organic light-emitting display device according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, "connected" includes physically and/or electrically connected. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "above" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

FIG. 1 is a cross-sectional view of an organic light-emitting display device according to an embodiment of the present invention. For convenience of illustration, FIG. 1 illustrates only a single pixel of the organic light-emitting display device.

Referring to FIG. 1, the organic light-emitting display device according to the present embodiment includes a plurality of pixel units 100, and each of the pixel units 100 includes a plurality of sub-pixels 100B, 100G and 100R of different colors. In the illustrated embodiment, for example, the pixel unit 100 may include the red, green and red sub-pixels 100B, 100G, and 100R, but the present invention is not limited thereto. That is, the pixel unit 100 may include sub-pixels of different colors (for example, cyan, magenta, and yellow sub-pixels).

In detail, a plurality of first electrodes 120 may be on a substrate 110. The substrate 110 may be a flexible substrate. In this case, a flexible organic light-emitting display device may be embodied. However, the present embodiment is not limited thereto, and, for example, the substrate 110 may be a glass substrate. Each first electrode 120 may be an anode. According to the present invention, the first electrode 120 may have reflectance close to about 100%. The first electrode 120 may include a composite layer including, for example, an indium tin oxide ("ITO") layer and a silver (Ag) layer. However, this is just an example, and the first electrode 120 may include various material layers.

When the organic light-emitting display device is driven in an active matrix ("AM") manner, the first electrodes 120 may have shapes (e.g., planar shapes) corresponding substantially to shapes of the sub-pixels 100B, 100G, and 100R, respectively. In this case, a thin film transistor ("TFT") may be connected to each of the first electrodes 120. In addition, when the organic light-emitting display device is driven in a passive matrix ("PM") manner, the first electrodes 120 may be in the form of stripes which extend parallel to each other.

A plurality of light-emitting layers 130B, 130G, and 130R of different colors are on the first electrodes 120, and a plurality of second electrodes 140 are on the light-emitting layers 130B, 130G, and 130R. Each second electrode 140 may be a cathode. According to the present embodiment, the second electrode 140 may have transmittance of about 40% to about 60%. The second electrode 140 may include a composite layer including, for example, a magnesium (Mg) layer and an Ag layer, but this is just an example. Thus, the second electrode 140 may include various material layers.

When the organic light-emitting display device is driven in the AM manner, the second electrodes 140 may be integrally formed to constitute a single unitary indivisible common electrode. When the organic light-emitting display device is driven in the PM manner, the second electrodes 140 and the first electrodes 120 may each be in the form of stripes which cross each other.

The light-emitting layers 130B, 130G, and 130R are between the first electrodes 120 and the second electrodes 140. The light-emitting layers 130B, 130G, and 130R correspond to the sub-pixels 100B, 100G and 100R, respectively, and may include, for example, blue, green, and red light-emitting layers 130B, 130G, and 130R, but the present embodiment is not limited thereto. That is, the light-emitting layers 130B, 130G, and 130R may include other light-emitting layers of different colors. The light-emitting layers 130B, 130G, and 130R may include a self-emissive material that emits light of a predetermined color by combining electrons and holes, such as a predetermined organic light emitting material. As materials of the light-emitting layers 130B, 130G, and 130R, a self-emissive material other than an organic light emitting material, such as quantum dot may be used. Barrier ribs 150 may be between the light-emitting layers 130B, 130G, and 130R.

A thin encapsulation film 160 may be on the second electrodes 140 in order to protect the light-emitting layers 130B, 130G, and 130R from an external environment such as water or oxygen. The thin encapsulation film 160 may have a small thickness of about 1 micrometer (μm) to about 10 μm, and may include a flexible material. Thus, a flexible display apparatus or a foldable display apparatus that is easily deformed and bent may be embodied by using the flexible thin encapsulation film 160. In addition, according to an embodiment of the present invention, the thin encapsulation film 160 may be formed by using a growth method at a low temperature of 100 Celsius (° C.) or less. By virtue of the low-temperature growth method, the thin encapsulation film 160 may be grown and formed directly on the second electrodes 140 without damaging the light-emitting layers 130B, 130G, and 130R.

The thin encapsulation film 160 may include a plurality of organic material layers 161a, 162a, and 163a, and a plurality of inorganic material layers 161b and 162b, which are alternately stacked. In detail, the thin encapsulation film 160 may include the first, second, and third organic material layers 161a, 162a, and 163a that are sequentially stacked, with the first inorganic material layer 161b between the first organic material layer 161a and the second organic material layer 162a, and the second inorganic material layer 162b between the second organic material layer 162a and the third organic material layer 163a. However, the number of the organic material layers, and the number of inorganic material layers of the present embodiment, that is, are just examples, the number of the first, second, and third organic material layers 161a, 162a, and 163a, and the number of the first and second inorganic material layers 161b and 162b may differ. Thus, the thin encapsulation film 160 may include at least one organic material layer, and at least one inorganic material layer. In one embodiment, for example the first, second, and third organic material layers 161a, 162a, and 163a may include an acrylate-based material, and the first and second inorganic material layers 161b and 162b may include an oxide-based material. However, these are just examples. That is, the first, second, and third organic material layers 161a, 162a, and 163a, and the first and second inorganic material layers 161b and 162b may include other various materials.

A color filter 170 is on the thin encapsulation film 160. The color filter 170 may include blue, green, and red color filter layers 170B, 170G, and 170R corresponding to the blue, green, and red light-emitting layers 130B, 130G, and 130R, respectively. Alternatively, when the light-emitting layers 130B, 130G, and 130R have other different colors, the color filter 170 includes color filter layers of colors corresponding to the colors of the light-emitting layers 130B, 130G, and 130R.

According to the present embodiment, the color filter 170 may be a low-temperature color filter that may be formed by using a low temperature method at a temperature of 100° C. or less. The low-temperature color filter may be formed by performing a curing process on an organic material by using ultraviolet ("UV") rays at a temperature of about 100° C. or less. In detail, typically, in order to form a color filter, a curing process, including baking a material at a high temperature of about 200° C. or more, is required. However, at a high temperature of 200° C. or more, the light-emitting layers 130B, 130G, and 130R may be damaged, and thus, it is difficult to form a color filter directly on the light-emitting layers 130B, 130G, and 130R. On the other hand, according to the present embodiment, when the color filter 170 includes a predetermined monomer (for example, a diacrylate monomer, or the like), a curing process may be performed by irradiating UV rays for a predetermined period of time at a low temperature of about 100° C. or less. In this case, the color filter 170 may be formed directly on the thin encapsulation film 160 through the low temperature process. Thus, it is possible to perform micropatterning for forming the color filter 170 directly on the thin encapsulation film 160, thereby realizing a high resolution image.

In the organic light-emitting display device according to the present embodiment, when the first electrodes 120 and the second electrodes 140, and the light-emitting layers 130B, 130G, and 130R between the first electrodes 120 and the second electrodes 140 constitute a microcavity structure, destructive interference of light that is emitted from an external source and is reflected off the microcavity structure may occur. By virtue of the destructive interference, reflectance of external light W is reduced, and outdoor visibility of the organic light-emitting display device may be improved. In order to cause the destructive interference, the blue, green, and red light-emitting layers 130B, 130G, and 130R may have different thicknesses. The thicknesses of the light-emitting layers 130B, 130G, and 130R are dependent upon color wavelengths and reflective indexes of the light-emitting layers 130B, 130G, and 130R.

Figure 2:
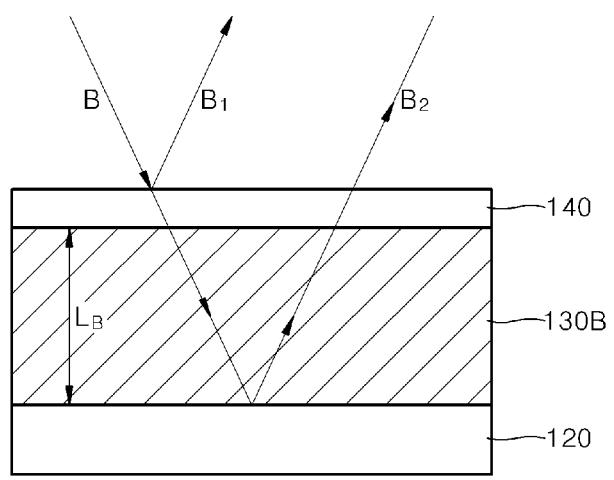
FIG. 2 shows a case where blue light emitted from an external source is reflected off and is transmitted through a blue light-emitting layer, in the organic light-emitting display device of FIG. 1, according to an embodiment of the present invention.

In detail, FIG. 2 shows a case where blue light B emitted from an external source is both reflected off and is transmitted through the blue light-emitting layer 130B, in the organic light-emitting display device of FIG. 1, according to an embodiment of the present invention. Referring to FIG. 2, the blue light B is transmitted through the blue color filter layer 170B (see FIG. 1) and is incident on the second electrode 140 from the external source. A portion of the blue light B is reflected off the second electrode 140, and s remaining portion of the blue light B is transmitted through the second electrode 140 toward the blue light-emitting layer 130B. In addition, blue light B2 initially transmitted through the second electrode 140 is further transmitted through the blue light-emitting layer 130B and is reflected off the first electrode 120. Then, the blue light B2 is again transmitted through the blue light-emitting layer 130B and the second electrode 140 and proceeds towards the outside of the second electrode 140. In this case, when blue light B1 that is reflected off the second electrode 140 and proceeds towards the outside of the second electrode 140, destructively interferes with the blue light B2 that is transmitted through the second electrode 140, reflected off the first electrode 120, and proceeds towards the outside of the second electrode 140, reflectance of the blue light B emitted from the external source may be reduced.

When a thickness ($L_B$) of the blue light-emitting layer 130B satisfies the condition, $2n_B L_B = m\lambda_B$, or $2n_B L_B = (m+1/2)\lambda_B$ (where $n_B$ and $\lambda_B$ are a refractive index of the blue light-emitting layer 130B and a wavelength of the blue light B, respectively, and m is an integer), the blue light B1 reflected off the second electrode 140 destructively interferes with the blue light B2 that is transmitted through the second electrode 140, reflected off the first electrode 120, and proceeds towards the outside of the second electrode 140. Thus, reflectance of blue light B that is emitted from the external source may be reduced.

Similarly, when a thickness ($L_G$) of the green light-emitting layer 130G satisfies the condition, $2n_G L_G = m\lambda_G$, or $2n_G L_G = (m+1/2)\lambda_G$ (where $n_G$ and $\lambda_G$ are a refractive index of the green light-emitting layer 130G and a wavelength of green light G, respectively, and m is an integer), green light reflected off the second electrode 140 destructively interferes with green light that is transmitted through the second electrode 140, reflected off the first electrode 120, and proceeds towards the outside of the second electrode 140. Thus, reflectance of green light emitted from the external source may be reduced.

In addition, when a thickness ($L_R$) of the red light-emitting layer 130R satisfies the condition, $2n_R L_R = m\lambda_R$, or $2n_R L_R = (m+1/2)\lambda_R$ (where $n_R$ and $\lambda_R$ are a refractive index of the red light-emitting layer 130R and a wavelength of red light R, respectively, and m is an integer), red light reflected off the second electrode 140 destructively interferes with red light that is transmitted through the second electrode 140, reflected off the first electrode 120, and proceeds towards the outside of the second electrode 140. Thus, reflectance of red light emitted from the external source may be reduced.

As described above, according to the present embodiment, the microcavity structure including the first electrodes 120, the light-emitting layers 130B, 130G, and 130R, and the second electrode 140 cause the reflected light beams of the blue, green, and red light B, G, and R transmitted through the color filter 170 from the external source to destructively interfere with light transmitted through the second electrode 140, reflected off the first electrode 120, and proceeds towards the outside of the second electrode 140, thereby reducing reflectance of external light. Thus, outdoor visibility of the organic light-emitting display device may be improved.

Figure 3:
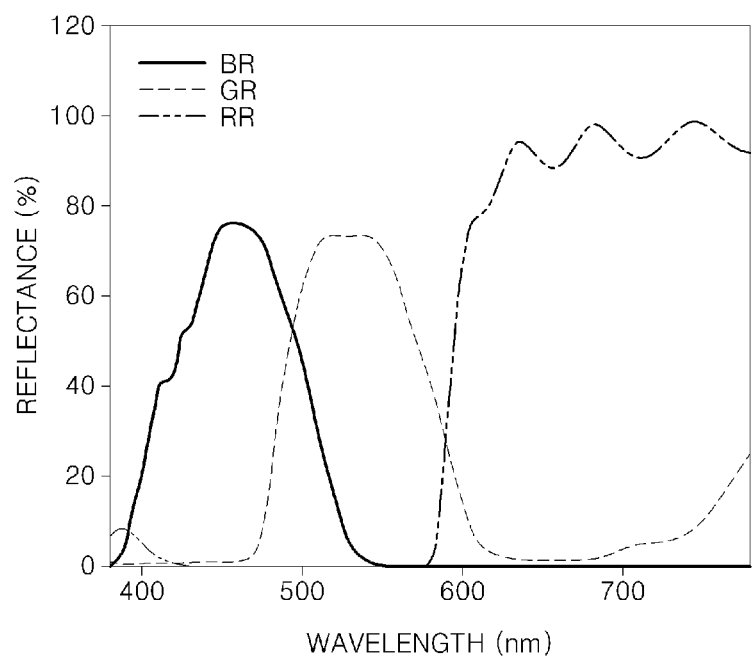
FIG. 3 is a graph illustrating reflectance of blue light, green light, and red light which are transmitted through a color filter from an external source and are reflected.

FIG. 3 is a graph illustrating reflectance in percent (%) of blue light, green light, and red light shown by wavelengths in units of nanometers (nm), which are transmitted through a color filter from an external source and are reflected. In detail, FIG. 3 shows the reflectance of the blue light, the green light, and the red light which are transmitted through the color filter, are entirely reflected, and proceed towards the outside. In FIG. 3, BR, GR, and RR are reflectance of the blue light, reflectance of the green light, and reflectance of the red light, respectively. Referring to FIG. 3, each of the blue light, the green light, and the red light has high reflectance of about 80%.

Figure 4:
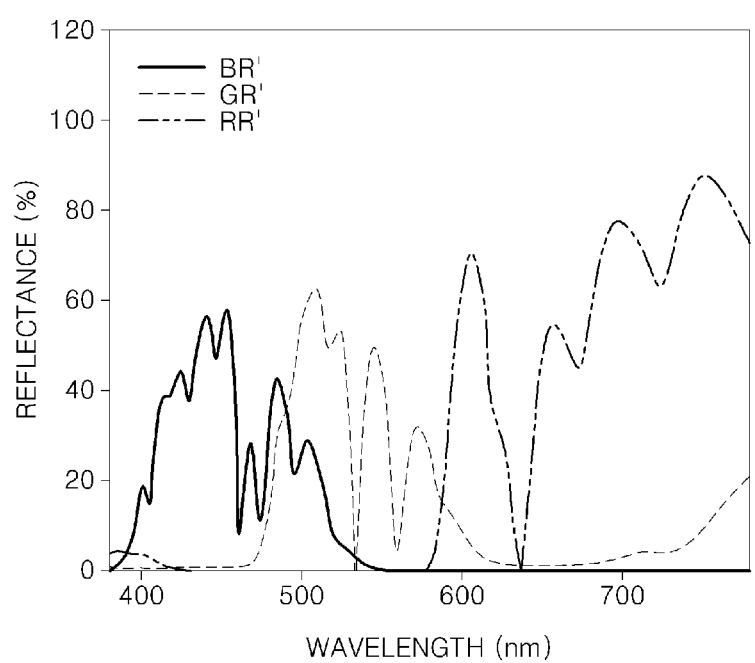
FIG. 4 is a graph illustrating reflectance of blue light, green light, and red light which are transmitted through a color filter of the organic light-emitting display device of FIG. 1 from an external source, are reflected off the microcavity structure, and destructively interfere with light emitted from an external source, according to an embodiment of the present invention.

FIG. 4 is a graph illustrating reflectance of blue light, green light, and red light which are transmitted through the color filter 170 of the organic light-emitting display device of FIG. 1 from an external source, are reflected off the microcavity structure, and destructively interfere with light emitted from an external source, according to an embodiment of the present invention. In detail, FIG. 4 shows the reflectance of the blue light, the green light, and the red light which are transmitted through the color filter 170 (see FIG. 1) from the external source, are reflected off the microcavity structure including the first electrodes 120, the light-emitting layers 130B, 130G, and 130R, and the second electrodes 140, destructively interfere with light emitted from an external source, and proceed back through the color filter 170. In FIG. 4, BR', GR', and RR' are reflectance of the blue light, reflectance of the green light, and reflectance of the red light, respectively. Referring to FIG. 4, according to the present embodiment, the reflectance of each of the blue light, the green light, and the red light which are reflected off the microcavity structure, and destructively interfere with light emitted from an external source, is reduced compared to the case of FIG. 3 by about 50% or more.

According to the present embodiment, since the first electrodes 120, the light-emitting layers 130B, 130G, and 130R, and the second electrodes 140 constitute the microcavity structure, and the color filter 170 including the color filter layers 170B, 170G and 170R of different colors corresponding to the light-emitting layers 130B, 130G, and 130R is provided, reflectance of external light may be reduced, and outdoor visibility may be improved.

Figure 5:
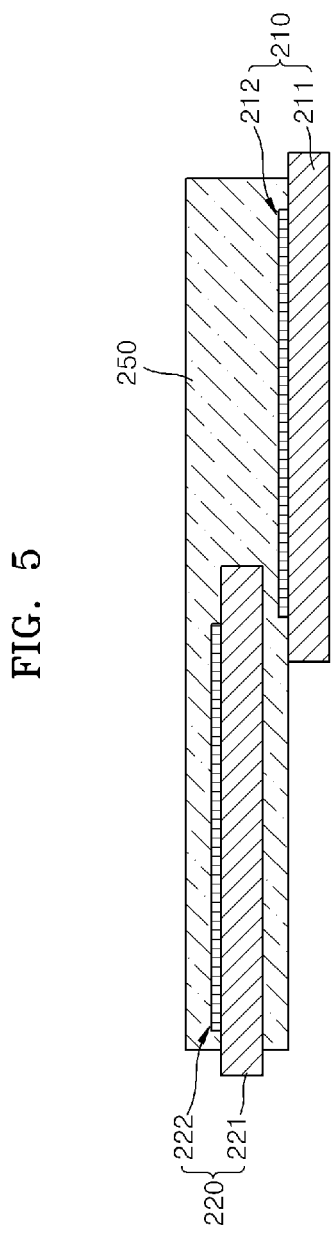
FIG. 5 is a cross-sectional view of a foldable display device according to another embodiment of the present invention.

FIG. 5 is a cross-sectional view of a foldable display device according to another embodiment of the present invention. In detail, FIG. 5 shows the foldable display device including the organic light-emitting display device of FIG. 1. The foldable display device according to the present embodiment is configured such that a plurality of display panels may be connected in various manners so as to realize a single display screen which displays a single image. However, for convenience of description, FIG. 5 shows an example of the foldable display device that is configured such that two display panels are connected so as to realize a single image.

Referring to FIG. 5, the foldable display device according to the present embodiment includes first and second organic light-emitting display panels 210 and 220 of which at least portions overlap each other, and a transparent plate 250 covering and overlapping the first and second organic light-emitting display panels 210 and 220. In detail, the second organic light-emitting display panel 220 is disposed on the first organic light-emitting display panel 210 so as to overlap a portion of the first organic light-emitting display panel 210. In addition, the transparent plate 250 surrounds at least a portion of the second organic light-emitting display panel 220, and covers an upper portion of the first organic light-emitting display panel 210.

The first organic light-emitting display panel 210 includes a first substrate 211 and a first organic light emitting device 212 on the first substrate 211, and the second organic light-emitting display panel 220 includes a second substrate 221, and a second organic light emitting device 222 on the second substrate 221. The first and second substrates 211 and 221 may be, for example, a glass substrate or a plastic substrate, and may be any substrate including various materials. In this case, each of the first and second organic light-emitting display panels 210 and 220 includes a plurality of pixel units, and each pixel unit has the same structure as a structure illustrated in FIG. 1. Thus, the detailed description of the first and second organic light-emitting display panels 210 and 220 will be omitted. Although not illustrated, a cover for protecting the first and second organic light emitting devices 212 and 222 may be further on the first and second substrates 211 and 221.

If the first and second organic light-emitting display panels 210 and 220 are arranged so that boundary surfaces of the first and second organic light emitting devices 212 and 222 correspond to each other in a vertical direction (e.g., are aligned), an image looks continuous at a joint portion of the first and second organic light-emitting display panels 210 and 220. Nevertheless, a user may be inconvenienced and observe a degraded image due to a step difference between the first and second organic light-emitting display panels 210 and 220. Thus, according to the present embodiment, in order to remove the inconvenience of the degraded image, the transparent plate 250 is disposed surrounding an entire portion or almost an entire portion of the second organic light-emitting display panel 220. The transparent plate 250 may be integral with the second organic light-emitting display panel 220, which will be described below. In addition, the transparent plate 250 may cover an entire portion or almost an entire portion of an upper surface of the first organic light-emitting display panel 210. FIG. 5 shows a case where the transparent plate 250 completely covers the first and second organic light emitting devices 212 and 222, taken with the first and second substrates 211 and 221.

The transparent plate 250 may include a soft material that is flexible and elastically restores so as to easily deform when the first and second organic light-emitting display panels 210 and 220 are folded using the joint as a folding line. The transparent plate 250 may include one material selected from the group consisting of, for example, polymethyl methacrylate ("PMMA"), polydimethylsiloxane ("PDMA"), a transparent silicone resin, and Teflon®, but is not limited thereto. In order to control a reflective index of the transparent plate 250, the transparent plate 250 may include an appropriate additive. If the transparent plate 250 includes the soft material, when the transparent plate 250 overlaps the first organic light-emitting display panel 210 which is below the transparent plate 250, the transparent plate 250 and the first organic light-emitting display panel 210 may be closely attached to each other since the soft material is elastically and compressively deformed.

When the second organic light-emitting display panel 220 is within the transparent plate 250, formation of an air gap between the second organic light-emitting display panel 220 and the transparent plate 250 may be prevented. The inconvenience of a degraded image between the first and second organic light-emitting display panels 210 and 220, which is generated if light is scattered or totally reflected in the air gap, may be removed. When the transparent plate 250 extends covering the first organic light emitting device 212, which is a light-emitting region of the first organic light-emitting display panel 210, an entire upper surface of the foldable display device according to the present embodiment may be planarized. Thus, the inconvenience of a degraded image generated due to the step difference between the first organic light-emitting display panel 210 and the second organic light-emitting display panel 220 may be reduced or removed.

The transparent plate 250 may be formed integrally with the second organic light-emitting display panel 220 as an upper panel. In one embodiment, for example, when the transparent plate 250 is formed of a transparent silicon resin, the second organic light-emitting display panel 220 may be inserted in a shaping mold which is filled with the liquid silicon resin, in a liquid shaping operation, and then the liquid silicon resin may be cured. Then, the second organic light-emitting display panel 220 is formed within the transparent plate 250 so as to be integrated to the transparent plate 250.

In more detail, the second organic light-emitting display panel 220 is prepared, and a liquid soft material including, for example, PMMA, PDMA, a transparent silicon resin, or Teflon® are prepared. Then, the liquid soft material is poured into the shaping mold, and then the second organic light-emitting display panel 220 is inserted into the liquid soft material within the shaping mold. After the second organic light-emitting display panel 220 is arranged so as to be surrounded by the liquid soft material, the liquid soft material is cured by using an appropriate curing method. According to the type of the liquid soft material, a UV curing method or a thermal curing method may be used, for example. Then, when the cured soft material is injected to a predetermined thickness, the transparent plate 250 surrounding the second organic light-emitting display panel 220 may be obtained. In this case, a thickness of the transparent plate 250 may be appropriately adjusted according to a thickness of the second organic light-emitting display panel 220.

In order to improve the performance of the foldable display device, a predetermined optical film (not shown) may be further attached onto the transparent plate 250 including the soft material. In embodiments of the present invention, for example, a polarization film, an anti-reflection ("AR") film, an anti-glare ("AG") film, or the like may be attached onto a surface of the transparent plate 250.

Likewise, in the foldable display device according to one or more embodiments of the present invention, a continuous and smooth image may be obtained through two panels by reducing or removing the inconvenience of a degraded image due to a step difference between the panels, by using organic light-emitting display panels and a soft transparent plate.

As described above, according to one or more embodiments of the present invention, reflectance of external light may be reduced by using a color filter, and light-emitting layers having a microcavity structure, and thus, outdoor visibility may be improved, and power consumption may be reduced. In order to protect the light-emitting layer, a flexible thin encapsulation film of a thickness of several millimeters (mm), including an organic material layer and an inorganic material layer, may be used, and thus, it is easy to embody a flexible display device. In addition, the color filter may be formed by using a patterning method on the thin encapsulation film, and thus, a high-resolution organic light-emitting display device may be embodied. Moreover, since a plurality of organic light-emitting display devices are connected, a foldable display device that is easily folded may be embodied It should be understood that the embodiments described therein should be considered in a descriptive sense only and not for purposes of limitation. Descriptions of aspects within each embodiment should typically be considered as available for other similar aspects in other embodiments.

What is claimed is:

1. A method of forming an organic light-emitting display device, the method comprising:
    disposing a plurality of first electrodes on a substrate;
    disposing a plurality of light-emitting layers on the plurality of first electrodes, the light-emitting layers having different colors and different thicknesses from each other;
    disposing a plurality of second electrodes on the light-emitting layers;
    forming a flexible encapsulation film directly on the plurality of second electrodes, at a first temperature of 100 degrees Celsius or less, and
    disposing a color filter on the flexible encapsulation film, the color filter comprising a plurality of color filter layers having colors corresponding to the plurality of light-emitting layers,
    wherein
    the flexible encapsulation film includes at least one organic material layer and at least one inorganic material layer which alternate, and is about 1 micrometer to about 10 micrometers in thickness, and
    when a wavelength of light transmitted through a color filter layer of a predetermined color is $\lambda$, and a thickness and a refractive index of a light-emitting layer corresponding to the color filter layer are L and n, respectively, $2nL=m\lambda$, or $2nL=(m+1/2)\lambda$ (where m is an integer) is satisfied.

2. The method of claim 1, further comprising:
forming a color filter directly on the flexible encapsulation film, at a second temperature of 100 degrees Celsius or less.

3. An organic light-emitting display device comprising:
a substrate;
a plurality of first electrodes on the substrate;
a plurality of light-emitting layers on the plurality of first electrodes, and having different colors and different thicknesses;
a plurality of second electrodes on the light-emitting layers;
a flexible thin encapsulation film on the plurality of second electrodes; and
a color filter on the flexible thin encapsulation film and comprising a plurality of color filter layers having colors corresponding to the plurality of light-emitting layers,
wherein, when a wavelength of light transmitted through a color filter layer of a predetermined color is $\lambda$, and a thickness and a refractive index of a light-emitting layer corresponding to the color filter layer are L and n, respectively, $2nL=m\lambda$, or $2nL=(m+1/2)\lambda$ (where m is an integer) is satisfied.

4. The organic light-emitting display device of claim 1, wherein the flexible thin encapsulation film has a thickness of about 1 micrometer to about 10 micrometers.

5. The organic light-emitting display device of claim 1, wherein the flexible thin encapsulation film includes at least one organic material layer and at least one inorganic material layer which alternate with each other.

6. The organic light-emitting display device of claim 5,
wherein the at least one organic material layer comprises an acrylate-based material, and
wherein the at least one inorganic material layer comprises an oxide-based material.

7. The organic light-emitting display device of claim 1, wherein the flexible thin encapsulation film comprises a material which is grown at a low temperature of 100 degrees Celsius or less.

8. The organic light-emitting display device of claim 1, wherein the plurality of first electrodes comprises a material having a reflectance of substantially 100%.

9. The organic light-emitting display device of claim 8, wherein the plurality of second electrodes comprises a material having transmittance of about 40% to about 60%.

10. The organic light-emitting display device of claim 1, wherein the substrate comprises a flexible substrate.

11. The organic light-emitting display device of claim 1, wherein the color filter comprises an organic material which is cured by using ultraviolet rays at a temperature of about 100 degrees Celsius or less.

12. The organic light-emitting display device of claim 1,
wherein the plurality of color filter layers comprise red, green, and blue color filter layers, and
wherein the plurality of light-emitting layers comprise red, green, and blue light-emitting layers.

13. The organic light-emitting display device of claim 1,
wherein the plurality of first electrodes correspond to the plurality of light-emitting layers, and
wherein the plurality of second electrodes collectively form a single unitary indivisible common electrode.

14. The organic light-emitting display device of claim 1, wherein the plurality of first electrodes and the plurality of second electrodes are each stripe-shaped and respectively cross each other.

15. A foldable display device comprising:
first and second organic light-emitting display panels of which at least portions overlap each other; and
a transparent plate which surrounds at least a portion of the second organic light-emitting display panel and covers the first organic light-emitting display panel,
wherein each of the first and second organic light-emitting display panels comprises:
a substrate;
a plurality of first electrodes on the substrate;
a plurality of light-emitting layers on the plurality of first electrodes and having different colors and different thicknesses;
a plurality of second electrodes on the light-emitting layers;
a flexible thin encapsulation film on the plurality of second electrodes; and
a color filter on the flexible thin encapsulation film and comprising a plurality of color filter layers having colors corresponding to the plurality of light-emitting layers,
wherein, when a wavelength of light transmitted through a color filter layer of a predetermined color is $\lambda$, and a thickness and a refractive index of a light-emitting layer corresponding to the color filter layer are L and n, respectively, $2nL=m\lambda$, or $2nL=(m+1/2)\lambda$ (where m is an integer) is satisfied.

16. The foldable display device of claim 15, wherein the transparent plate comprises a soft material.

17. The foldable display device of claim 15, wherein the transparent plate is integral with the second organic light-emitting display panel.

18. The foldable display device of claim 15, further comprising an optical film on the transparent plate.

19. The foldable display device of claim 15, wherein the flexible thin encapsulation film has a thickness of about 1 micrometer to about 10 micrometers.

20. The foldable display device of claim 15, wherein the flexible thin encapsulation film includes at least one organic material layer and at least one inorganic material layer which alternate with each other.

21. The foldable display device of claim 15, wherein
the plurality of first electrodes comprises a material having a reflectance of substantially 100%, and
wherein the plurality of second electrodes comprises a material having transmittance of about 40% to about 60%.

22. The foldable display device of claim 15, wherein the substrate comprises a flexible substrate.

* * * * *